(12) United States Patent
Bilewicz et al.

(10) Patent No.: US 11,924,974 B2
(45) Date of Patent: *Mar. 5, 2024

(54) APPARATUS FOR MOUNTING COMPONENTS ON A SUBSTRATE

(71) Applicant: BESI SWITZERLAND AG, Cham (CH)

(72) Inventors: Norbert Bilewicz, Vomp (AT); Andreas Mayr, Wiesing (AT); Hugo Pristauz, St. Johann i. Tirol (AT); Hubert Selhofer, Innsbruck (AT)

(73) Assignee: BESI SWITZERLAND AG, Cham (CH)

( * ) Notice: Subject to any disclaimer, the term of this patent is extended or adjusted under 35 U.S.C. 154(b) by 0 days.

This patent is subject to a terminal disclaimer.

(21) Appl. No.: 18/196,661

(22) Filed: May 12, 2023

(65) Prior Publication Data

US 2023/0284426 A1    Sep. 7, 2023

Related U.S. Application Data

(62) Division of application No. 17/196,798, filed on Mar. 9, 2021, now Pat. No. 11,696,429, which is a division (Continued)

(30) Foreign Application Priority Data

Apr. 28, 2017 (CH) ...................................... 0575/17

(51) Int. Cl.
*H05K 13/04* (2006.01)
*H01L 21/67* (2006.01)
(Continued)

(52) U.S. Cl.
CPC ... *H05K 13/0413* (2013.01); *H01L 21/67144* (2013.01); *H01L 21/67276* (2013.01);
(Continued)

(58) Field of Classification Search
CPC ........... H05K 13/0413; H05K 13/0815; H05K 13/046; H01L 21/67144; H01L 21/67276;
(Continued)

(56) References Cited

U.S. PATENT DOCUMENTS 5,059,559 A    10/1991 Takahashi et al.
7,597,234 B2   10/2009 Blessing et al.
(Continued)

FOREIGN PATENT DOCUMENTS

DE    102016113328 A1    3/2017
JP    H06140799 A        5/1994
(Continued)

OTHER PUBLICATIONS

SG Patent Office Search Report in Related Case, SN 102 018 029 76 S dated Aug. 28, 2020.

(Continued)

*Primary Examiner* — Jigneshkumar C Patel
(74) *Attorney, Agent, or Firm* — CanaanLaw, P.C.; David B. Ritchie

(57) ABSTRACT

The invention relates to an apparatus for mounting components on a substrate. The apparatus comprises a bond head with a component gripper, a first drive system for moving a carrier over relatively long distances, a second drive system which is attached to the carrier for moving the bond head back and forth between a nominal working position and a stand-by position, a drive attached to the bond head for rotating the component gripper or a rotary drive for rotating the substrate about an axis, at least one substrate camera attached to the carrier and at least one component camera. At least one reference mark is attached to the bond head or the component gripper.

20 Claims, 5 Drawing Sheets

Figure 1:
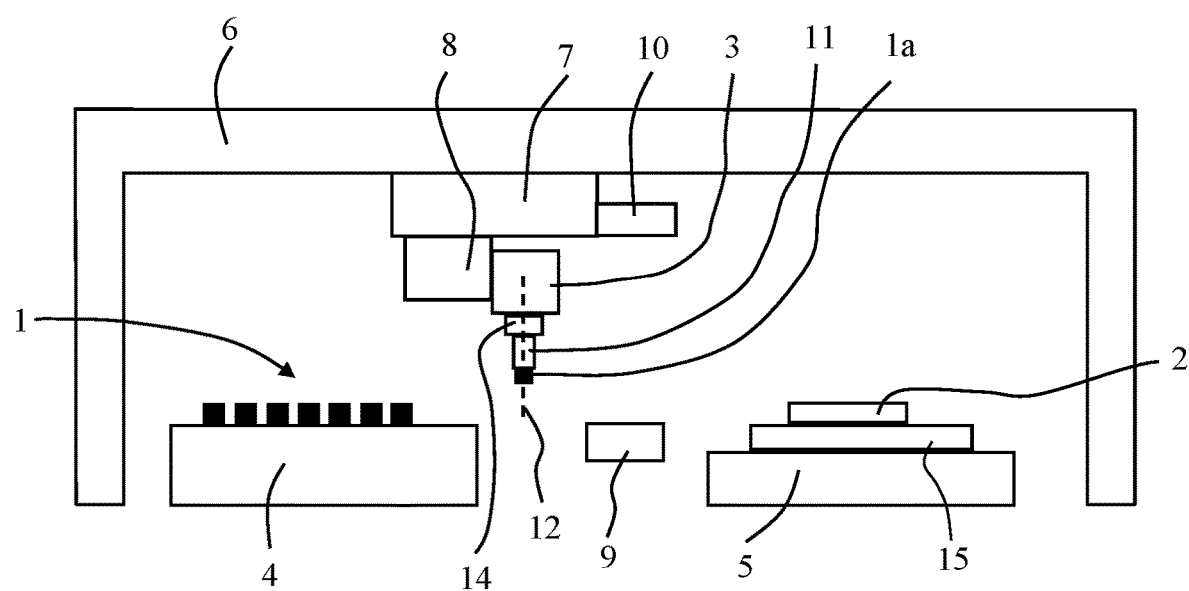

Related U.S. Application Data of application No. 15/947,571, filed on Apr. 6, 2018, now Pat. No. 10,973,158.

(51) Int. Cl.
  *H01L 21/68* (2006.01)
  *H01L 23/00* (2006.01)
  *H05K 13/08* (2006.01)

(52) U.S. Cl.
  CPC .......... *H01L 21/681* (2013.01); *H01L 24/741* (2013.01); *H05K 13/046* (2013.01); *H05K 13/0815* (2018.08); *G05B 2219/45031* (2013.01)

(58) Field of Classification Search
  CPC ................ H01L 21/681; H01L 24/741; H01L 2224/75824; H01L 24/75; H01L 2224/81121; H01L 2224/7598; H01L 2224/75753; H01L 2224/75842; H01L 21/67132
  USPC ........................................................ 228/105
  See application file for complete search history.

(56) References Cited

U.S. PATENT DOCUMENTS

| | | | |
|---|---|---|---|
| 8,133,823 | B2 | 3/2012 | Behler et al. |
| 10,973,158 | B2 | 4/2021 | Bilewicz et al. |
| 2002/0079350 | A1 | 6/2002 | Terada et al. |
| 2003/0046812 | A1 | 3/2003 | Terada et al. |
| 2003/0106210 | A1 | 6/2003 | Arai et al. |
| 2004/0188642 | A1 | 9/2004 | Kodama et al. |
| 2005/0088666 | A1 | 4/2005 | Yakiyama et al. |
| 2010/0122455 | A1* | 5/2010 | Noda ................ H01L 21/67144 29/832 |
| 2013/0133188 | A1 | 5/2013 | Suter et al. |
| 2015/0029329 | A1 | 1/2015 | Hachiya et al. |
| 2016/0079199 | A1 | 3/2016 | Seok et al. |
| 2017/0062257 | A1 | 3/2017 | Speer |

FOREIGN PATENT DOCUMENTS

| | | |
|---|---|---|
| JP | 3129134 B2 | 1/2001 |
| JP | 2007173801 A | 7/2007 |
| JP | 2008060137 A | 3/2008 |
| JP | 2011014866 A | 1/2011 |
| JP | 2013016739 A | 1/2013 |
| JP | 2015195261 A | 11/2015 |
| JP | 2016171107 A | 9/2016 |
| JP | 2017069554 A | 4/2017 |
| KR | 1020070066946 A | 6/2007 |
| TW | 201503314 A | 1/2015 |
| TW | 201633441 A | 9/2016 |
| WO | 2015052755 A1 | 4/2015 |
| WO | 2015199045 A1 | 12/2015 |

OTHER PUBLICATIONS

TW Patent Office Search Report in Related Case, SN 107114542 dated Jul. 9, 2021, iss'd Jul. 12, 2022 and rec'd Jul. 14, 2021.
KR Patent Office Opinion on Patentability in Related Case, SN 10-2018-0048520 dated Nov. 10, 2022 and iss'd Jul. 12, 2021.

\* cited by examiner

APPARATUS FOR MOUNTING COMPONENTS ON A SUBSTRATE

PRIORITY CLAIM

The present application is a divisional of U.S. patent application Ser. No. 17/196,798 filed Mar. 9, 2021 which is a divisional of U.S. patent application Ser. No. 15/947,571 filed Apr. 6, 2018 in the name of inventors Andreas Mayr, Hugo Pristauz, Hubert Selhofer and Norbert Bilewicz and entitled "Apparatus and method for mounting components on a substrate," which claims foreign priority under 35 U.S.C § 119 from Swiss Application No. 00575/17 filed Apr. 28, 2017, the disclosures of which are herein incorporated by reference.

FIELD OF THE INVENTION

The invention relates to an apparatus for mounting components on a substrate, typically electronic or optical components, in particular semiconductor chips and flip chips, on a substrate. In the field, the mounting is also referred to as bonding process or assembly process.

BACKGROUND OF THE INVENTION

Apparatuses of this type are particularly used in the semiconductor industry. Examples of such apparatuses are Die Bonders or Pick and Place machines, with which components in the form of semiconductor chips, flip chips, micromechanical, micro-optical and electro-optical components, and the like are deposited on substrates such as leadframes, printed circuit boards, ceramics, etc. and bonded. The components are picked up by a bond head at a removal location, in particular sucked in, moved to a substrate location and deposited at a precisely defined position on the substrate. The bond head is part of a Pick and Place system, which enables movement of the bond head in at least three space directions. In order to enable the component to be positioned accurately on the substrate, both the exact position of the component gripped by the bond head with respect to the positioning axis of the bond head and the exact position of the substrate place must be determined.

Mounting devices available on the market achieve in the best case a positioning accuracy of 2 to 3 micrometers with a standard deviation of 3 sigma.

SHORT DESCRIPTION OF THE INVENTION

The object of the invention is to develop an apparatus, which achieves a higher placement accuracy compared to the state of the art.

The apparatus according to the invention comprises a bond head with a component gripper, a first drive system for moving a carrier over relatively long distances, a second drive system attached to the carrier for moving the bond head back and forth between a nominal working position and a stand-by position, a drive attached to the bond head for rotating the component gripper or a rotary drive for rotating the substrate about an axis running perpendicularly to the substrate surface, at least one substrate camera attached to the carrier and at least one component camera. The bond head or the component gripper contains at least one reference mark used by both the at least one component camera and the at least one substrate camera to determine the position of the component relative to the bond head or the position of the bond head relative to the substrate location, respectively. The substrate contains at least one substrate mark and the component contains at least one component mark or a structure suitable to serve as component mark.

The first drive system serves to move the bond head over relatively long distances with relatively low positioning accuracy. The second drive system serves to move the bond head back and forth between the nominal working position and the stand-by position. In the nominal working position, the bond head covers the substrate mark(s) attached to the substrate and is therefore temporarily moved to the stand-by position where the bond head no longer covers the substrate mark(s) so that the substrate camera(s) can take an image of the substrate mark(s). The second drive system preferably serves also to move the bond head over relatively small distances with very high positioning accuracy, i.e. to perform high-precision correction movements of the bond head. Alternatively, a third drive system can be provided to perform high-precision correction movements of the substrate.

BRIEF DESCRIPTION OF THE DRAWING FIGURES

Figure 2:
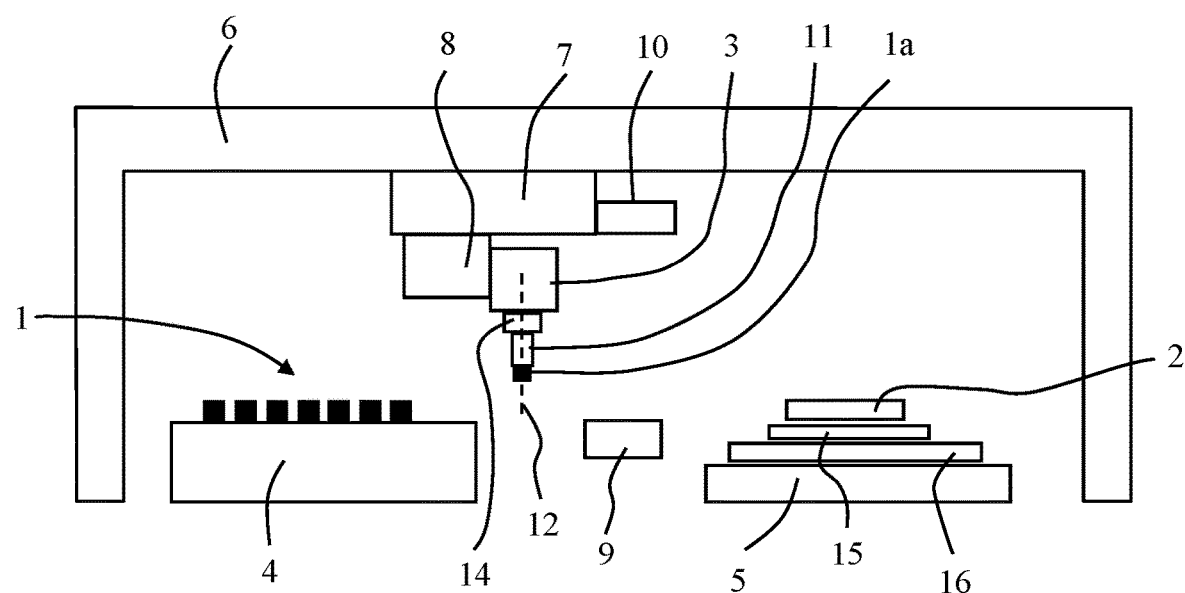
Figure 3:
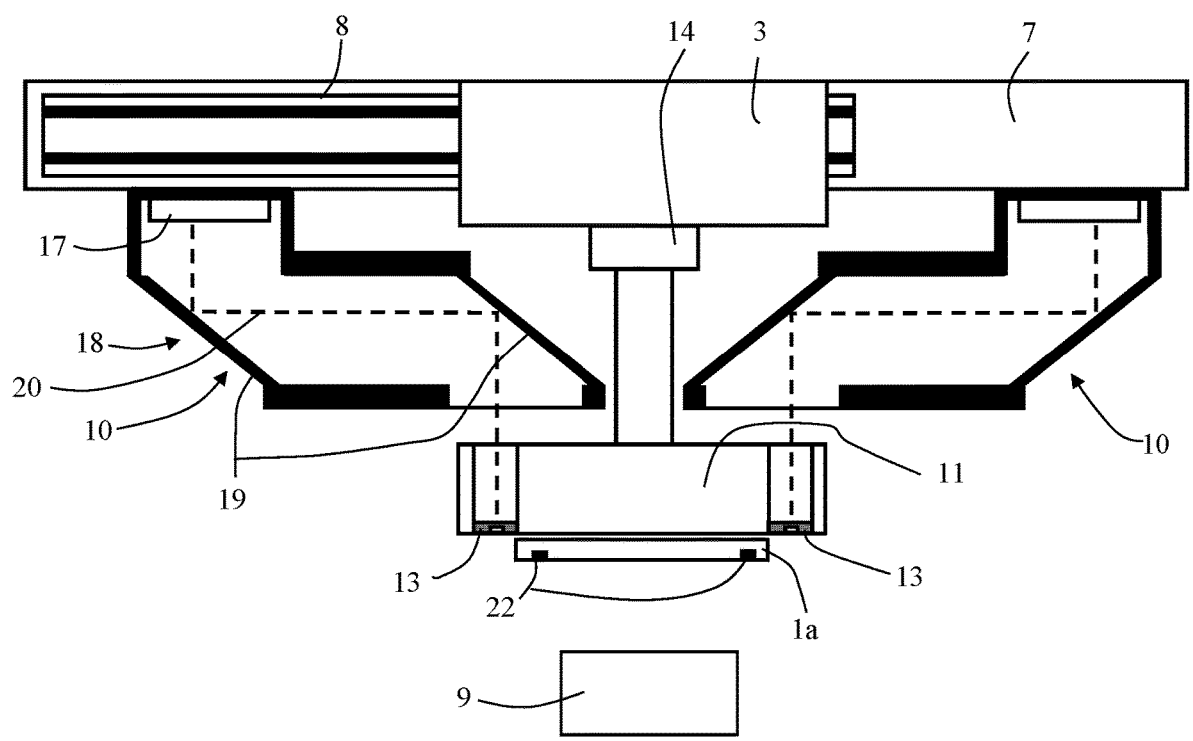
Figure 4:
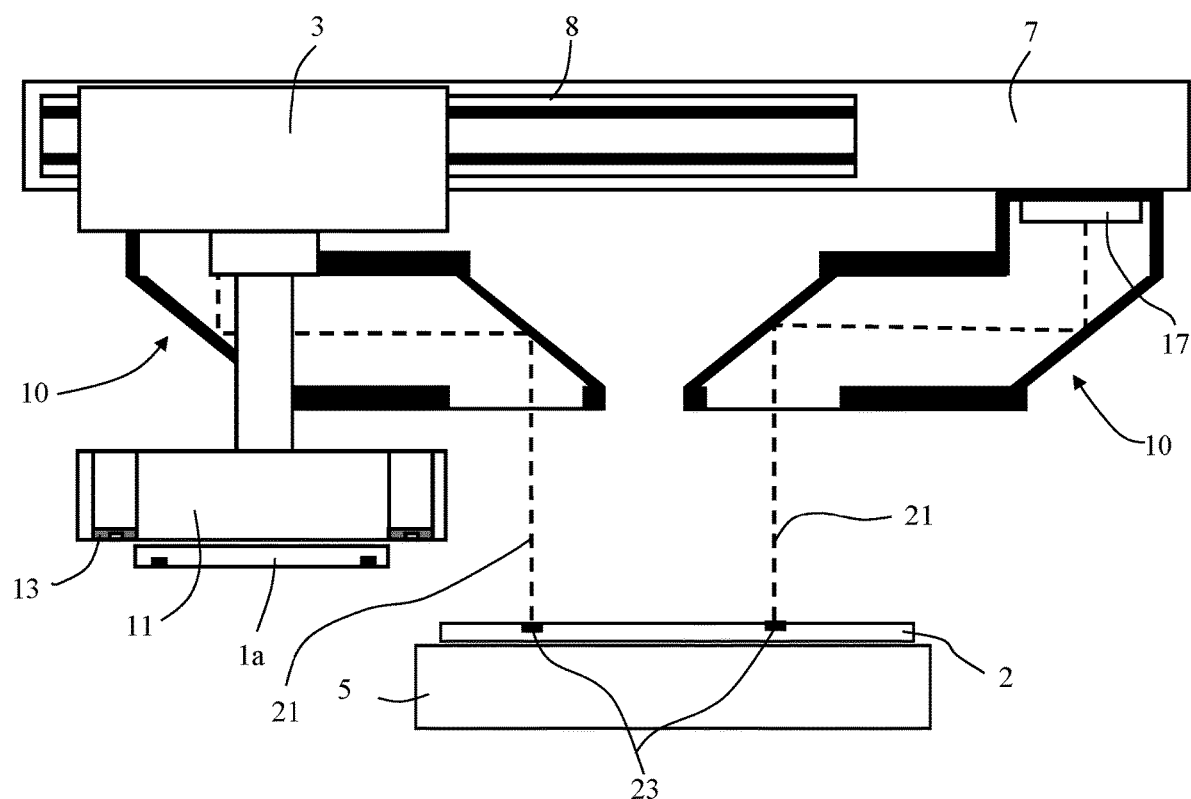
Figure 5:
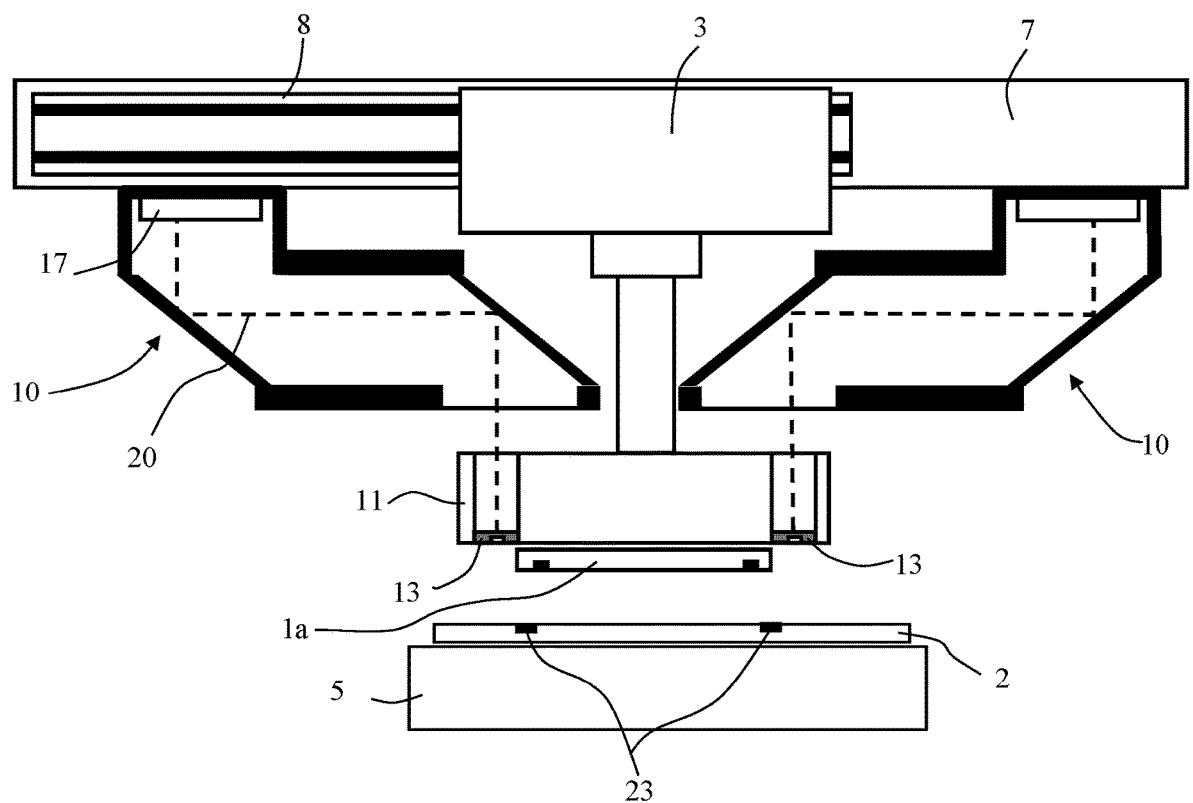

The accompanying drawings, which are incorporated into and constitute a part of this specification, illustrate one or more embodiments of the present invention and, together with the detailed description, serve to explain the principles and implementations of the invention. The figures are not to scale. In the drawings:

FIG. 1 schematically shows a first embodiment of an apparatus for mounting components on a substrate according to the invention, FIG. 2 schematically shows a second embodiment of an apparatus for mounting components on a substrate according to the invention, and FIGS. 3-5 show snapshots taken during the assembly process according to the invention.

DETAILED DESCRIPTION OF THE INVENTION

FIG. 1 schematically shows a first embodiment of an apparatus for mounting components 1 on a substrate 2 according to the invention. The substrates 2 contain at least one substrate mark 23 (FIG. 3). The components 1 are flip chips in particular, but also other semiconductor chips. The components 1 can also be electronic, optical or electro-optical or any other components which are to be mounted with a precision in the micrometer range or submicrometer range.

The mounting apparatus includes a bond head 3, a feeding unit 4 for supplying the components 1, a device 5 for feeding and providing the substrates 2, and a first drive system 6 for a carrier 7 and a second drive system 8 for the bond head 3. The second drive system 8 is attached to the carrier 7. The apparatus further includes at least one component camera 9 and at least one substrate camera 10. The substrate camera(s) 10 is/are attached to the carrier 7. The bond head 3 comprises a component gripper 11, which is rotatable about an axis 12. In the following, a component held by the bond head 3 is referred to as component 1a. The component gripper 11 is, for example, a vacuum-operated suction element that sucks in a component 1.

The feeding unit 4 comprises, for example, a wafer table, which provides a plurality of semiconductor chips, and a flip device, which removes one semiconductor chip after the other from the wafer table and provides it as flip chip for transfer to the bond head 3. The feeder unit 4 can also be a feeder unit that provides flip chips or other components one after the other for transfer to the bond head 3.

The bond head 3 or the component gripper 11 contains at least one reference mark 13 (FIG. 3), advantageously at least two reference marks 13, so that both a displacement of the component 1a held by the component gripper 11 of the bond head 3 and a rotation of the component 1a from its set position can be detected and corrected. The reference mark(s) 13 is/are mounted on the bond head 3 or component gripper 11 in such a way that it/they is/are visible in the image supplied by the component camera 9 or the images supplied by the component cameras 9, when the bond head 3 is in the field of view of the component camera 9 or the fields of view of the component cameras 9, and is/are visible in the image supplied by the substrate camera 10 or the images supplied by the substrate cameras 10, respectively, when the bond head 3 is in the field of view of the substrate camera 10 or the fields of view of the substrate cameras 10, respectively. The reference mark(s) 13 is/are for example formed as cross in bore(s) in the component gripper 11, preferably they are formed on a platelet of glass in the form of structures of chrome. Glass is transparent, so that the reference mark(s) 13 is/are seen from above as well as from below and thus by all cameras 9 and 10. Preferably, a glass with a very low coefficient of thermal expansion is chosen. The thickness of the glass plate is advantageously selected so that at a certain height of the bond head 3 above the substrate 2, both the reference mark(s) 13 and the substrate mark(s) 23 are imaged with sufficient sharpness in the image captured by the substrate camera(s) 10, i.e. that both the reference mark(s) 13 and the substrate mark(s) 23 are in the depth of field of the substrate camera(s) 10.

The first drive system 6 serves to transport the bond head 3 over relatively long distances, namely from a component removal location, where the bond head 3 takes the component 1 to be mounted from the feeder unit 4, to the substrate 2, where the bond head 3 places the component 1a on a substrate place of the substrate 2. The requirements for the position accuracy of the first drive system 6 are relatively modest, a position accuracy of +/−10 µm is usually sufficient. The first drive system 6 is designed, for example, as a so-called "gantry" with two or more mechanically highly stable axes of motion, of which two axes of motion allow movements of the carrier 7 in two horizontal directions running perpendicular to each other.

The up and down movements of the bond head 3 to remove a component 1 from the feeder unit 4 and to place the component 1a on the substrate place of the substrate 2 can be done in different ways, for example the first drive system 6 contains a third, highly stable axis of motion for the up and down movement of the carrier 7, the second drive system 8 contains an additional, high-precision drive for the up and down movements of the bond head 3, the bond head 3 contains a high-precision drive for up and down movements of the component gripper 11, which is advantageously supported by air or ball bearings.

The apparatus may contain only one, or two or all three of the above axes of motion/drives for the up and down movements.

The second drive system 8 serves on the one hand to move the bond head 3 into a stand-by position, as described below in more detail, and on the other hand to enable high-precision correction movements of the bond head 3 in two different horizontal directions. The second drive system 8 comprises a first drive for moving the bond head 3 along a first direction designated as u-direction and a second drive for moving the bond head 3 along a second direction designated as v-direction. The directions u and v run in horizontal direction and preferably orthogonally to each other. The bond head 3 comprises, optionally, a drive 14 for the rotation of the component gripper 11 around the axis 12. The device 5 for feeding and providing the substrates 2 may contain a rotary drive 15 in order to rotate the substrate 2 about an axis running orthogonally to its surface in order to alternatively eliminate any angular errors in this manner.

The component camera 9 or the several component cameras 9 serve to detect the position of the component 1a in relation to the position of the reference mark(s) 13. The substrate camera 10 or the substrate cameras 10 serve to detect the position of the substrate place on which the component 1a is to be placed, in relation to the position of the reference mark(s) 13. Each component camera 9 and each substrate camera 10 comprises an image sensor 17 and an optics 18 (FIG. 3). The optics 18 of the substrate camera(s) 10 comprises for example two deflecting mirrors 19.

The component camera(s) 9 is/are, for example, arranged stationary on the apparatus and the bond head 3 is moved on its way from the component removal location to the substrate location above the component camera(s) 9 and is preferably, but not necessarily, stopped for taking one or more images. The component camera(s) 9 can alternatively be attached to the carrier 7. For example, either the component camera(s) 9 or the bond head 3 is/are attached to the carrier 7 by means of a retractable and extendable swivel mechanism. The component camera(s) 9 or the bond head 3, respectively, is then retracted into an image capture position while moving from the component removal location to the substrate location, so that one or more images per component camera 9 can be captured during the move. For the removal of the component 1 from the feeder unit 4 and for recording the images with the substrate camera(s) 10 and for depositing the component 1a, the component camera(s) 9 is/are extended into a stand-by position and the bond head 3 is extended into its working position.

The range of motion of the second drive system 8 is relatively small and even very small compared to the range of motion of the first drive system 6. The second drive system 8 must be able to move the bond head 3 from a nominal working position to the stand-by position in which the substrate marks 23 are not covered by the bond head 3 on the one hand, and on the other hand enable high-precision correction movements of the bond head 3 in two different horizontal directions. For this purpose, it is sufficient if the range of motion of the second drive system 8 is relatively long in one horizontal direction and very short in the other horizontal direction. The range of motion in one direction is typically a few ten millimeters, for example 20 mm or 30 mm or more, the range of motion in the other direction is typically (only) a few micrometers.

The nominal working position of the bond head 3 is a position that differs only slightly from the final position which the bond head 3 occupies in the last step of the assembly process. The accuracy requirements for the nominal working position are relatively low, as any deviation from the nominal working position is automatically compensated later in the assembly process.

The apparatus is configured, to lower the carrier 7 and/or the bond head 3 and/or the component gripper 11 so far that the underside of the component 1a is located at an extremely low height of typically only 50-200 µm above the substrate surface, and only then take an image of the substrate mark(s) 23 with the substrate camera(s) 10. In doing so, it is achieved that the only movement after the determination of the actual position of the component 1a with respect to its set position on the substrate place and after the execution of the high-precision correction movements is only the lowering movement of the carrier 7 and/or the bond head 3 and/or the component gripper 11 and that this distance is so short that any displacements in the u-direction and in the v-direction during this lowering movement are in the submicrometer range.

From the moment when the carrier 7 has reached its position in the area of the substrate 2, the position of the substrate camera(s) 10 relative to substrate 2 no longer changes. From this moment on, only the position of the bond head 3 is changed, namely by means of the second drive system 8. The position of the reference mark(s) 13 can therefore be monitored until the component 1a is placed on the substrate 2 and any new deviation from its set position that might occur during the final lowering phase of the component 1a can be corrected. The components can therefore be mounted with an unprecedented precision in the submicrometer range.

FIG. 2 illustrates a second embodiment of an apparatus according to the invention, which is largely similar to the first embodiment, but with the essential difference that the second drive system 8 is designed to move the bond head 3 back and forth between the nominal working position and the stand-by position, but not for the high-precision correction movements, and that the device 5 for feeding and providing the substrates 2 comprises a third drive system 16, which enables high-precision correction movements of the substrate 2 in at least two different horizontal directions. The second drive system 8 can therefore only move the bond head 3 in a single direction running parallel to the surface of the substrate 2. However, the second drive system 8 may optionally also be designed to raise and lower the bond head 3, i.e. to move the bond head 3 in the direction running orthogonally to the surface of the substrate 2. However, the high-precision correction movements in the plane running parallel to the surface of the substrate 2 are performed in this embodiment by the third drive system 16. The third drive system 16 comprises a first drive for moving the substrate 2 along a first direction, again designated as u-direction, and a second drive for moving the substrate 2 along a second direction, again designated as v-direction. The directions u and v run in horizontal direction and preferably orthogonally to each other. The third drive system 16 may optionally also have a rotary drive 15 which allows rotation of the substrate 2 about an axis perpendicular to the surface of substrate 2 in order to eliminate any angular errors.

With this apparatus a similarly high positioning accuracy can be achieved, even if during the last phase of the lowering of the component 1a, further correction movements of the substrate 2 that may still be necessary and that are carried out can no longer be checked for correct attainment.

The mounting of a component 1 is now explained in detail. The mounting method according to the invention comprises the following steps A to O. The steps can be in part executed in a different order.

A) with the component gripper 11 picking up a component 1 from the feeding unit 4.
B) with the first drive system 6 moving the carrier 7 to the component camera 9 or the component cameras 9, so that the reference mark or the reference marks 13 and the component 1a are in the field of vision of the component camera 9 or in the fields of vision of the component cameras 9.

With a mounting apparatus, in which the component camera(s) 9 is/are arranged stationary, step B is carried out by: With the first drive system 6 moving the carrier 7 to the component camera 9 or the component cameras 9. In a mounting apparatus in which the component camera(s) 9 is/are attached to the carrier 7, step B is performed by: Moving the component camera(s) 9 and the bond head 3 relative to each other into an image acquisition position.

C) take one or more images with the component camera 9 or the component cameras 9.

The components 1 contain component marks 22 (FIG. 3) or other structures that can be used as component marks. The component marks 22 serve to detect the position of the component 1a with respect to the reference mark(s) 13 with the required accuracy.

In a mounting apparatus in which the component camera(s) 9 is/are attached to the carrier 7, step C is followed by the step: Moving the component camera(s) 9 and the bond head 3 relative to each other so that the bond head 3 is in its normal working position and, if necessary, the component camera(s) 9 is in a stand-by position.

D) determining a first correction vector describing a deviation of the actual position of the component 1a from its set position with respect to the reference mark(s) 13 on the basis of the image(s) taken in the previous step.

The first correction vector comprises three components $\Delta x_1$, $\Delta y_1$ und $\Delta \varphi_1$, wherein $\Delta x_1$ designates the displacement of a reference point of the component 1a in a first direction designated as $x_1$-direction and $\Delta y_1$ the displacement of the reference point of the component 1a in a second direction designated as $y_1$-direction and $\Delta \varphi_1$ designates the rotation of the component 1a around the reference point of the component 1a with respect to the reference mark(s) 13. The components $\Delta x_1$ und $\Delta y_1$ are given in pixel coordinates of the component camera(s) 9, the component $\Delta \varphi_1$ is an angle. The first correction vector is a null vector, if the the actual position of the component 1a already corresponds to its set position.

E) from the first correction vector calculating a first correction movement.

The first correction movement comprises three correction values $\Delta u_1$, $\Delta v_1$ and $\Delta \theta_1$. The correction values $\Delta u_1$ and $\Delta v_1$ are calculated from the components $\Delta x_1$, $\Delta y_1$ and $\Delta \theta_1$. The correction value $\Delta \theta_1$ is calculated from the angular error $\Delta \varphi_1$. The correction values $\Delta u_1$, $\Delta v_1$ and $\Delta \theta_1$ are all given in machine coordinates of the corresponding drives. The correction values $\Delta u_1$ and $\Delta v_1$ indicate the distances by which the second drive system 8 must move the bond head 3 (in the apparatus shown in FIG. 1) or the third drive system 16 must move the substrate 2 (in the apparatus shown in FIG. 2) in the direction designated as the u-direction and in the direction designated as the v-direction, and the correction value $\Delta \theta_1$ indicates the angle by which the drive 14 mounted on the bond head 3 must rotate the component gripper 11 or the rotary drive 15 must rotate the substrate 2 in order to eliminate the detected deviation of the actual position of the component 1a from its set position relative to the reference mark(s) 13.

F) with the first drive system 6 moving the carrier 7 to a position above a substrate place of the substrate 2.
G) lowering the carrier 7 to a height above the substrate 2 at which the underside of the component 1a held by the component gripper 11 is located at a predetermined distance D above the substrate place, wherein the distance D is dimensioned such that both the reference mark(s) 13 and the substrate mark(s) 23 lie in the depth of field of the substrate camera(s) 10.

The distance D is typically about 50-200 micrometers, but is not limited to these values. However, the distance D is so small that when the component 1a is subsequently lowered to the substrate place, usually no displacements of the component 1a occur in the directions u and v that lead to a significant position error.

H) with the second drive system 8 moving the bond head 3 to a stand-by position.

Steps F, G and H can be executed one after the other or simultaneously, i.e. in parallel. The carrier 7 and thus also the substrate camera(s) 10 attached to the carrier 7 are no longer moved during the following, remaining steps.

During steps A to G, the bond head 3 is usually in its nominal working position. The substrate camera(s) 10 does not see the substrate marks 23 because the bond head 3 covers them. The position of the stand-by position is selected such that the bond head 3 does not cover the substrate mark(s) 23.

I) with the substrate camera(s) 10 taking a first image, wherein the field of view of the substrate camera 10 or each of the fields of view of the substrate cameras 10 contains at least one substrate mark 23 arranged on the substrate 2.

J) with the second drive system 8 moving the bond head 3 to the nominal working position in which the field of view of the substrate camera 10 or each of the fields of view of the substrate cameras 10 contains at least one reference mark 13.

K) with the substrate camera(s) 10 taking a second image.

L) determining a second correction vector describing a deviation of the actual position of the substrate place from its set position with respect to the reference mark 13 or the reference marks 13, respectively, using the first and second image or the first and second images taken with the substrate camera(s) 10.

The second correction vector comprises three components $\Delta x_2$, $\Delta y_2$ und $\Delta \varphi_2$, wherein $\Delta x_2$ designates the displacement of the reference mark(s) 13 in a first direction designated as $x_2$-direction and $\Delta y_2$ the displacement of the reference mark(s) 13 in a second direction designated as $y_2$-direction and $\Delta \varphi_2$ designates the rotation of the reference mark(s) 13 with respect to the substrate place. The components $\Delta x_2$ und $\Delta y_2$ are given in pixel coordinates of the substrate camera(s) 10, the component $\Delta \varphi_2$ is an angle.

M) from the second correction vector calculating a second correction movement.

The second correction movement comprises three correction values $\Delta u_2$, $\Delta v_2$ and $\Delta \theta_2$. The correction values $\Delta u_2$, and $\Delta v_2$ are calculated from the components $\Delta x_2$, $\Delta y_2$ and $\Delta \varphi_2$. The correction value $\Delta \theta_2$ is calculated from the angular error $\Delta \varphi_2$. The correction values $\Delta u_2$, $\Delta v_2$ and $\Delta \theta_2$ are all given in machine coordinates of the corresponding drives. The correction values $\Delta u_2$, and $\Delta v_2$ indicate the distances by which the second drive system 8 must move the bond head 3 (in the apparatus shown in FIG. 1) or the third drive system 16 must move the substrate 2 (in the apparatus shown in FIG. 2) in the direction designated as the u-direction and in the direction designated as the v-direction, and the correction value $\Delta \theta_2$ indicates the angle by which the drive 14 mounted on the bond head 3 must rotate the component gripper 11 or the rotary drive 15 must rotate the substrate 2 in order to eliminate the detected deviation of the reference mark(s) 13 of the bond head 3 from their set position in relation to the substrate mark(s) 23 of the substrate 2.

N) executing the first and second correction movement.

The displacements by the correction values $\Delta u_1$, $\Delta v_1$, $\Delta u_2$, and $\Delta v_2$ are carried out by the second drive system 8 for the apparatus according to FIG. 1 and by the third drive system 16 for the apparatus according to FIG. 2. The rotation by the correction values $\Delta \theta_1$ and $\Delta \theta_2$ is performed by the drive 14 or the rotary drive 15.

O) lowering the carrier 7 and/or the bond head 3 and/or the component gripper 11 and place the component 1a on the substrate place.

If the mounting process is carried out with an apparatus according to FIG. 1, the method may optionally also include steps P to T, which are carried out once or several times after step N:

P) taking an image with the substrate camera 10 or the substrate cameras 10.

Q) determining the actual position(s) of the reference mark(s) 13 using the image from the substrate camera 10 or the images from the substrate cameras 10.

R) with the first correction vector calculating corrected actual position(s) of the reference mark 13 or the reference marks 13.

The first correction movement calculated in step E and executed in step N for the bond head 3 and the component gripper 11 also shifts the position of the reference mark(s) 13. This shift of the reference mark(s) 13 is deducted in step R, because the first correction movement has nothing to do with the orientation with respect to the substrate position.

S) determining a further correction vector describing the deviation of the corrected actual position(s) of the reference mark(s) 13 from its/their set position in relation to the substrate mark(s) 23.

T) from the further correction vector calculating a further correction movement for the bond head 3 and the component gripper 11.

The further correction movement for the bond head 3 and the component gripper 11 comprises components $\Delta u_w$, $\Delta v_w$, which are given in machine coordinates of the second drive system 8, and a component $\Delta \theta_w$, which is an angular change in machine coordinates of the drive 14 or the rotary drive 15.

U) with the second drive system 8 executing the further correction movement for the bond head 3 and with the drive 14 or the rotary drive 15 executing the further correction movement for the component gripper 11.

until each component of the further correction vector is smaller than a limit value assigned to the component.

The optional steps P to U serve to check whether the bond head 3 has actually reached a position within the required accuracy after executing the correction movements in step N, and if this is not the case, iteratively perform further correction steps until this is the case. The detected deviation must for each component be within the required accuracy.

Step O of the method according to the invention can—especially in the case of an apparatus according to FIG. 1—be supplemented by a monitoring in which the position of the reference mark(s) 13 is continuously detected by means of the substrate camera(s) 10 while the carrier 7 or the bond head 3 or the component gripper 11 is lowered and stabilized by means of the second drive system 8 and the drive 14 or the rotary drive 15, to avoid any change of the position of the reference mark(s) 13 and thus of the component 1a. Step O can therefore be replaced by the following step O1:

O1) lowering the carrier 7 and/or the bond head 3 and/or the component gripper 11 and placing the component 1a on the substrate place, wherein the position of the reference mark(s) 13 is continuously detected by means of the substrate camera 10 or the substrate cameras 10 during the lowering and stabilized by means of the second drive system 8 and, optionally, also by means of the drive 14 or the rotary drive 15.

The substrate camera or substrate cameras 10 (including image evaluation) and the second drive system 8, if necessary together with the drive 14 or the rotary drive 15, form a closed loop axis of motion.

FIGS. 3 to 5 show snapshots taken during the mounting process according to the invention. The illustration is carried out using a mounting apparatus comprising a single component camera 9 and two substrate cameras 10, the two substrate cameras 10 being attached to the carrier 7 as mentioned above.

FIG. 3 shows a section of the mounting apparatus after step B. FIG. 4 shows a section of the mounting apparatus during step I, when the bond head 3 is in the standby position and the two substrate cameras 10 take the first image. FIG. 5 shows a section of the mounting apparatus a little bit later during step K, when the bond head 3 is in a position, in which each of the fields of view of the two substrate cameras 10 contains at least one reference mark 13. The position of the substrate cameras 10 relative to the substrate 2 has not changed during the movement of the bond head 3 from the state shown in FIG. 4 to the state shown in FIG. 5. FIGS. 3 and 5 also illustrate the beam path 20 from the reference marks 13 to the image sensors 17 of the substrate cameras 10, while FIG. 4 illustrates the beam path 21 from the substrate marks 23 to the image sensors 17 of the substrate cameras 10.

The placement of the substrate marks 23 on the substrates 2 is left to the users of the mounting apparatus of the invention. A mounting apparatus with a single substrate camera 10 requires a different arrangement of the reference mark(s) 13 on the bond head 3 or component gripper 11 and the substrate mark(s) 23 on the substrate 2. Since the components 1 are usually rectangular, the component mark(s) 22, the reference mark(s) 13 and the substrate mark(s) 23 are often arranged in two diagonally opposite corners of the rectangle or in two adjacent corners of the rectangle, as this achieves the highest accuracy.

In the embodiment shown in FIGS. 3 and 4, the bond head 3 moves from its nominal working position to the stand-by position in a direction lying in the drawing plane. However, it can also occur in a direction perpendicular to the drawing plane.

The term "component camera" is to be understood functionally, i.e. an optical deflection system can form a component camera together with the substrate camera, as described in the published patent application US 20170092613 (A), which is incorporated by reference into this application. In such a case, a (single) camera and a first optical deflection system form together a first image detection system which makes it possible to take an image of the substrate location on which the component is to be mounted, and the camera, the first optical deflection system and a second optical deflection system form together a second image detection system which makes it possible to take an image of the underside of the component held by the bond head. The first image detection system corresponds to the substrate camera and the second image detection system corresponds to the component camera. The first optical deflection system may under certain circumstances also be omitted.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

The invention claimed is:

1. An apparatus for mounting components on a substrate, the apparatus comprising:
    a bond head with a component gripper,
    at least one reference mark arranged at at least one of the bond head and the component gripper,
    a feeding unit configured to supply a component,
    a substrate device configured to provide a substrate,
    a first drive system configured to move a carrier,
    a second drive system attached to the carrier and configured to move the bond head in at least one direction,
    a drive attached to the bond head and configured to rotate the component gripper about an axis, or, a rotary drive attached to the substrate device and configured to rotate the substrate about an axis,
    at least one substrate camera, and
    at least one component camera, or, at least one optical deflection system which, together with the at least one substrate camera, forms at least one component camera,
    wherein
        the substrate camera or the substrate cameras, respectively, is/are attached to the carrier,
        the carrier is movable to the feeding unit by means of the first drive system,
        either the carrier is movable to the component camera(s) by means of the first drive system or the component camera(s) is/are fixed to the carrier and swivelable in relation to the bond head, so that the reference mark(s) and a component gripped by the component gripper are in the field of view of the component camera or in the fields of view of the component cameras, so that an actual position of the component is detectable in relation to the reference mark(s),
        the carrier is movable above a substrate place of the substrate by means of the first drive system and the bond head is movable by means of the second drive system in a standby position, in which the field of view of the substrate camera or each of the fields of view of the substrate cameras contains at least one substrate mark arranged on the substrate, and
        the bond head is movable by means of the second drive system in a nominal working position, in which the field of view of the substrate camera contains the reference mark(s), or, each of the fields of view of the substrate cameras contains at least one reference mark, and wherein a distance between an underside of the component and the substrate is reducible to the extent that both the reference mark(s) and the at least one substrate mark are in the depth of field of the substrate camera(s).

2. The apparatus according to claim 1, in which the second drive system is configured to move the bond head back and forth between the nominal working position and the stand-by position on the one hand and to enable correction movements of the bond head on the other hand.

3. The apparatus according to claim 2, in which the substrate camera or the substrate cameras and the second drive system and the drive or the rotary drive form a closed loop axis of motion.

4. The apparatus according to claim 3, in which the second drive system is configured to move the bond head back and forth between the nominal working position and the stand-by position, and which comprises a third drive system, which allows movements of the substrate.

5. The apparatus according to claim 2, in which the second drive system is configured to move the bond head back and forth between the nominal working position and the stand-by position, and which comprises a third drive system, which allows movements of the substrate.

6. The apparatus according to claim 2, in which the component camera or the component cameras is/are fastened to the carrier and is/are movable or swivelable relative to the bond head.

7. The apparatus according to claim 3, in which the component camera or the component cameras is/are fastened to the carrier and is/are movable or swivelable relative to the bond head.

8. The apparatus according to claim 1, in which the substrate camera or the substrate cameras and the second drive system and the drive or the rotary drive form a closed loop axis of motion.

9. The apparatus according to claim 8, in which the second drive system is configured to move the bond head back and forth between the nominal working position and the stand-by position, and which comprises a third drive system, which allows movements of the substrate.

10. The apparatus according to claim 8, in which the component camera or the component cameras is/are fastened to the carrier and is/are movable or swivelable relative to the bond head.

11. The apparatus according to claim 1, in which the second drive system is configured to move the bond head back and forth between the nominal working position and the stand-by position, and which comprises a third drive system, which allows movements of the substrate.

12. The apparatus according to claim 1, in which the component camera or the component cameras is/are fastened to the carrier and is/are movable or swivelable relative to the bond head.

13. An apparatus for mounting components on a substrate, the apparatus comprising:
  a bond head with a component gripper,
  at least one reference mark arranged at at least one of the bond head and the component gripper,
  a feeding unit configured to supply a component,
  a substrate device configured to provide a substrate,
  a first drive system configured to move a carrier,
  a second drive system attached to the carrier and configured to move the bond head in at least one direction,
  a drive attached to the bond head and configured to rotate the component gripper about an axis, or, a rotary drive attached to the substrate device and configured to rotate the substrate about an axis,
  at least one substrate camera, and
  at least one component camera, or, at least one optical deflection system which, together with the at least one substrate camera, forms at least one component camera, wherein
    the carrier is movable to the feeding unit by means of the first drive system,
    either the carrier is movable to the component camera(s) by means of the first drive system or the component camera(s) is/are fixed to the carrier and swivelable in relation to the bond head, so that the reference mark(s) and a component gripped by the component gripper are in the field of view of the component camera or in the fields of view of the component cameras, so that an actual position of the component is detectable in relation to the reference mark(s),
    the carrier is movable above a substrate place of the substrate by means of the first drive system and the bond head is movable by means of the second drive system in a standby position, in which the field of view of the substrate camera or each of the fields of view of the substrate cameras contains at least one substrate mark arranged on the substrate, and
    the bond head is movable by means of the second drive system in a nominal working position, in which the field of view of the substrate camera contains the reference mark(s), or, each of the fields of view of the substrate cameras contains at least one reference mark, and wherein a distance between an underside of the component and the substrate is reducible to the extent that both the reference mark(s) and the at least one substrate mark are in the depth of field of the substrate camera(s).

14. The apparatus according to claim 13, in which the second drive system is configured to move the bond head back and forth between the nominal working position and the stand-by position on the one hand and to enable correction movements of the bond head on the other hand.

15. The apparatus according to claim 14, in which the substrate camera or the substrate cameras and the second drive system and the drive or the rotary drive form a closed loop axis of motion.

16. The apparatus according to claim 15, in which the second drive system is configured to move the bond head back and forth between the nominal working position and the stand-by position, and which comprises a third drive system, which allows movements of the substrate.

17. The apparatus according to claim 14, in which the second drive system is configured to move the bond head back and forth between the nominal working position and the stand-by position, and which comprises a third drive system, which allows movements of the substrate.

18. The apparatus according to claim 13, in which the substrate camera or the substrate cameras and the second drive system and the drive or the rotary drive form a closed loop axis of motion.

19. The apparatus according to claim 18, in which the second drive system is configured to move the bond head back and forth between the nominal working position and the stand-by position, and which comprises a third drive system, which allows movements of the substrate.

20. The apparatus according to claim 13, in which the second drive system is configured to move the bond head back and forth between the nominal working position and the stand-by position, and which comprises a third drive system, which allows movements of the substrate.

* * * * *